(12) United States Patent
Krieger et al.

(10) Patent No.: US 6,744,021 B2
(45) Date of Patent: Jun. 1, 2004

(54) MICROPROCESSOR CONTROLLED HEATER/COOLER SYSTEM

(75) Inventors: Michael Krieger, Miami Beach, FL (US); Bruce Randolph, Ft. Lauderdale, FL (US)

(73) Assignee: Vector Products, Inc., Ft. Lauderdale, FL (US)

( * ) Notice: Subject to any disclaimer, the term of this patent is extended or adjusted under 35 U.S.C. 154(b) by 34 days.

(21) Appl. No.: 10/280,036

(22) Filed: Oct. 25, 2002

(65) Prior Publication Data

US 2003/0197004 A1 Oct. 23, 2003

Related U.S. Application Data

(60) Provisional application No. 60/372,734, filed on Apr. 17, 2002.

(51) Int. Cl.$^7$ ................................................. H05B 1/02
(52) U.S. Cl. ....................... 219/494; 219/497; 219/210; 62/3.2; 62/3.7
(58) Field of Search ................................. 219/494, 497, 219/209, 210, 501, 499; 62/3.2, 3.7

(56) References Cited

U.S. PATENT DOCUMENTS

| | | | |
|---|---|---|---|
| 5,431,021 A | * | 7/1995 | Gwilliam et al. ............. 63/3.2 |
| 5,613,364 A | | 3/1997 | Higgins |
| 5,640,852 A | * | 6/1997 | Atlas ............................ 62/3.7 |
| 5,653,741 A | | 8/1997 | Grant |
| 5,666,742 A | | 9/1997 | Greve et al. |
| 5,871,526 A | | 2/1999 | Gibbs et al. |
| 6,512,209 B1 | * | 1/2003 | Yano .......................... 219/497 |

* cited by examiner

*Primary Examiner*—Mark Paschall
(74) *Attorney, Agent, or Firm*—Venable LLP; Robert Kinberg; Jeffri A. Kaminski

(57) ABSTRACT

A portable heater/cooler system comprises a thermal electric module conducting a current through the module; a heater/cooler cavity coupled to the thermal electric module; a variable speed fan for blowing air over the thermal electric module and into the cavity; a first temperature sensor coupled to the thermal electric module for measuring the temperature of the module; a second temperature sensor coupled to the heater/cooler cavity for measuring the temperature in the cavity; and a microprocessor for adjusting a speed of the fan and the current flow through the thermal electric module as a function of the measured temperatures of the thermal electric module and the cavity.

19 Claims, 2 Drawing Sheets

MICROPROCESSOR CONTROLLED HEATER/COOLER SYSTEM

CROSS-REFERENCE TO RELATED APPLICATIONS

The present application claims the benefit of U.S. Provisional Patent Application No. 60/372,734, filed Apr. 17, 2002, entitled "Microprocessor Controlled Heater/Cooler System", the disclosure of which is incorporated herein by reference in its entirety.

BACKGROUND OF THE INVENTION

1. Field of the Invention

The present invention relates to a portable, self-contained heater/cooler system.

2. Related Art

A thermal electric module is a well-known interchangeable heating/cooling element. The thermal electric module typically has two heat transferring plates, separated by semi-conducting material, that transfer heat from one plate to the other when a current is applied to the semi-conducting material. Whether one of the two plates acts as either a heating plate or a cooling plate depends on the direction of the current through the thermal electric module. For example, when the current flows in a first direction through the thermal electric module, heat transfers from the first plate to the second plate so that the second plate gets hot while the first plate gets cold. When the current is reversed and flows in an opposite direction, heat transfers from the second plate to the first plate so that the first plate gets hot while the second plate gets cold.

Many conventional heating/cooling systems use thermal electric modules in combination with fans for air cooling/heating operations. In these systems, however, the speeds of the fans and the rates of the current flows through the thermal electric modules are fixed. With fixed fan speeds and fixed rates of current flow through the thermal electric module, these systems do not adapt to varying system conditions and are inefficient in achieving desired system conditions.

Therefore, there is a need for a portable self-contained heater/cooler system that adjusts various system parameters according to varying system conditions to reach desired system parameters in efficient ways.

SUMMARY OF THE INVENTION

In an exemplary embodiment of the present invention, a portable heater/cooler system, is provided, which comprises a thermal electric module conducting a current through the module; a heater/cooler cavity coupled to the thermal electric module; a variable speed fan for blowing air over the thermal electric module and into the cavity; a first temperature sensor coupled to the thermal electric module for measuring the temperature of the module; a second temperature sensor coupled to the heater/cooler cavity for measuring the temperature in the cavity; and a microprocessor for adjusting a speed of the fan and the current flow through the thermal electric module as a function of the measured temperatures of the thermal electric module and the cavity.

In another exemplary embodiment, the heater/cooler system comprises: a housing defining a cavity; a thermal electric module in communication with the cavity; an adjustable speed fan, the fan being arranged to blow air across the thermal electric module and into the cavity; a power supply supplying power to the fan and to the thermal electric module; a first temperature sensor arranged to measure a temperature of the thermal electric module; a second temperature sensor arranged to measure a temperature in the cavity; and a microprocessor receiving the measured temperatures of the thermal electric module and the cavity and controlling the power supplied to the fan and the power supplied to the thermal electric module based on at least one of the temperature in the cavity, the temperature of the thermal electric module, and a current flowing through the thermal electric module.

According to another aspect of the invention, there is provided a method for controlling a temperature in a cavity of a heater/cooler comprising: providing a module driving signal to a thermal electric module; providing a fan driving signal to an adjustable speed fan; blowing air with the fan through the thermal electric module and into the cavity; detecting a temperature of the thermal electric module; detecting a temperature in the cavity; adjusting the module driving signal based on the temperature in the cavity; adjusting the fan driving signal based on the temperature of the thermal electric module.

Further features and advantages of the invention, as well as the structure and operation of various embodiments of the invention, are described in detail below with reference to the accompanying drawings.

DETAILED DESCRIPTION OF THE INVENTION

A preferred embodiment of the invention is discussed in detail below wherein like reference numbers generally indicate identical, functionally similar, and/or structurally similar elements. While specific exemplary embodiments are discussed, it should be understood that this is done for illustration purposes only. A person skilled in the relevant art will recognize that other components and configurations can be used without departing from the spirit and scope of the invention.

Figure 1:
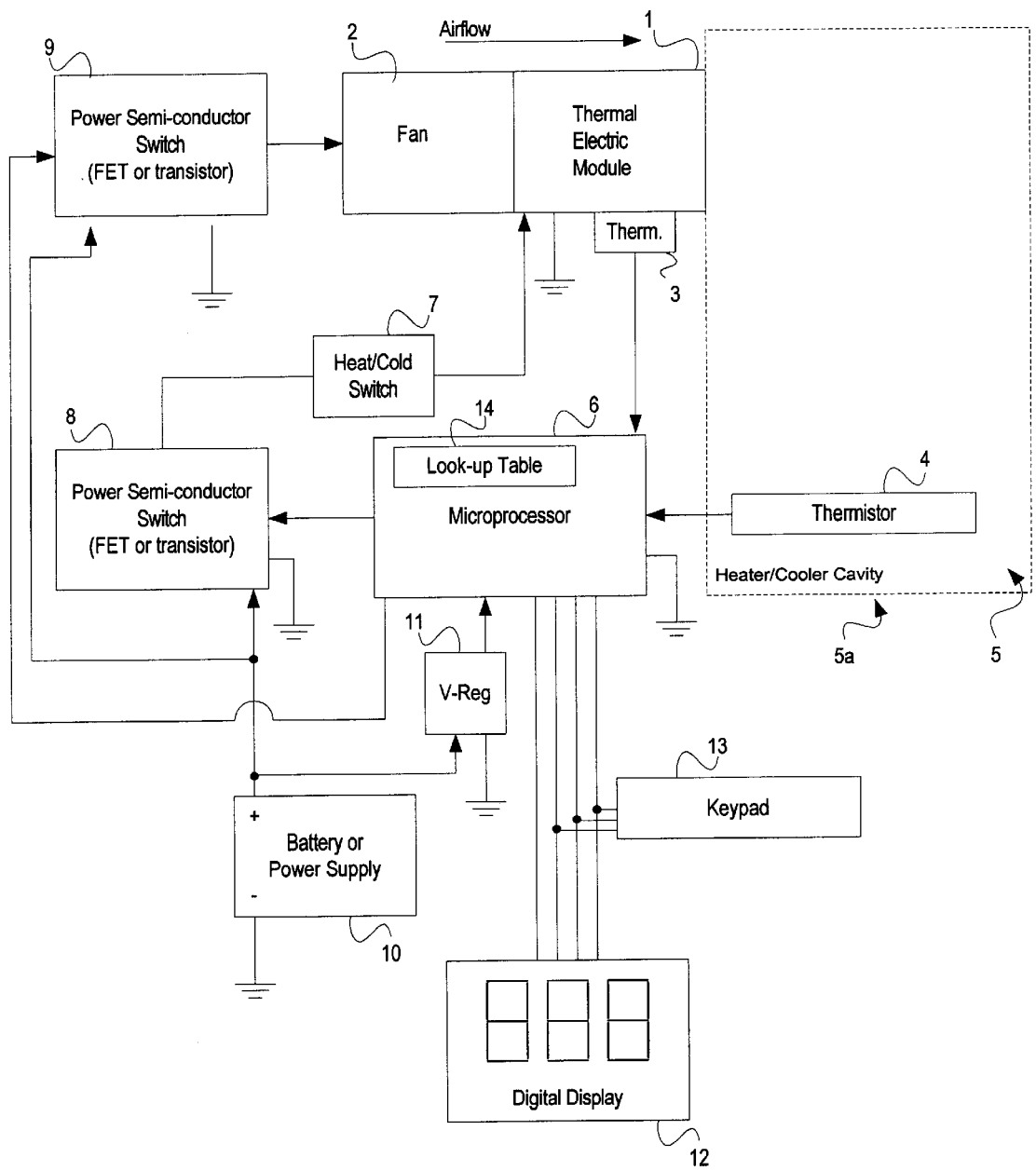
FIG. 1 illustrates a microprocessor controlled heater/cooler system according to a preferred embodiment of the invention.

FIG. 1 illustrates an example of a microprocessor controlled heater/cooler system according to an embodiment of the invention. The heater/cooler system includes a conventionally insulated housing 5a, that defines a heater/cooler cavity 5. The heater/cooler cavity 5 is adapted to contain objects that are to be heated or cooled. A thermal electric module 1 is provided to heat or cool the air in the cavity. The heating or cooling is achieved by transporting hot or cold air from the thermal electric module 1 into the heater/cooler cavity 5. A fan 2 may be used to blow the hot or cold air from the thermal electric module 1 into the heater/cooler cavity 5.

A power supply 10 provides power for the fan 2 and for the thermal electric module 1. The amount of power supplied to the module 1 and the fan 2 is regulated by a microprocessor 6 via switches 8 and 9, respectively. The amount of power supplied is controlled based on the operating conditions of the heater/cooler system. The operating conditions may include the temperature of the thermal electric module 1 and the temperature in the heater/cooler cavity 5. A temperature sensor 4 measures the temperature of the heater/cooler cavity 5 and a temperature sensor 3 measures the temperature of the thermal electric module 1. The temperature sensors may be thermistors. The microprocessor 6 receives the measured temperatures and controls the amount of power supplied accordingly. The control operation of the microprocessor 6 is described in more detail below.

Power supply 10 supplies power for the microprocessor 6. The power supply 10 may be either a battery or other DC supply. A voltage regulator 11 steps down a voltage supplied from the power supply 10 and provides the stepped-down voltage to power the microprocessor 6. The voltage regulator 11 supplies a lower voltage to the microprocessor 6 (e.g., five volts) than the supply voltage from the power supply 10. The stepped-down voltage may also used by the microprocessor 6 to detect a low voltage condition of the power supply 10 by monitoring the voltage level of the stepped-down voltage.

The low voltage condition can be indicated to an operator via a display 12 coupled to the microprocessor 6. The display 12 can also display various other information from the microprocessor, including a measured temperature of the cavity 5, an operator inputted desired temperature of the cavity, etc. An input device, such as keypad 13 coupled to the microprocessor 6, may be provided for the operator to input a desired temperature for the heater/cooler cavity or other information.

As mentioned above, the thermal electric module 1 includes two plates, separated by a semi-conducting material (not shown). A first of the two plates of the thermal electric module 1 is coupled to a heater/cooler cavity 5 and is operated as either a cooling plate or as a heating plate. Whether the thermal electric module operates as a heater or cooler depends on the direction of a current flow through these two plates. In FIG. 1, the direction of the current flow through the thermal electric module 1 is changed by a heat-cold switch 7. The heat-cold switch 7 reverses the polarity of a voltage applied across the thermal electric module 1 and is described in more detail below in connection with FIGS. 2–3.

An example of the operation of the heater/cooler system according to an exemplary embodiment of the invention is now described. As the first plate of the thermal electric module 1 that is coupled to the cavity 5 gets either hot or cold, the fan 2 blows air across the first plate and into the cavity 5 so that either hot or cold air is blown into the cavity 5. The fan 2 is preferably a variable speed fan. A fan speed of the fan 2 and a current flow rate into the module 1 are controlled so that the fan speed is varied to maintain an optimum relationship with a varying surface temperature of the first plate of the module 1. For example, when the cavity 5 is used as a cooler and the surface temperature of the first plate of the thermal electric module 1 is not cold enough, the fan speed of the fan 2 is set at a low speed to allow the surface of the first plate to get cold. Otherwise, warm air carried off the warm surface of the first plate will be blown into the cavity 5. When the surface temperature of the first plate becomes cold enough, then the fan speed is increased to blow cold air into the cavity 5. Temperatures of the thermal electric module 1 and the cavity 5 are constantly measured by the thermistors 3 and 4, respectively. The measured temperatures are used to vary the fan speed of the fan 2 and the rate (amp/second) of current flow through the thermal electric module 1 to optimum values to reach the desired temperature for the cavity 5, as entered via a keypad 13.

The microprocessor 6 may include a storage area 14 which stores look-up tables containing optimum values of the speed for the fan 2 and the current flow rate to the module 1 for each combination of measured temperature of the thermal electric module 1, measured temperature of the heater/cooler cavity 5, and a desired temperature of the cavity 5 input by an operator to the microprocessor via keypad 13. The microprocessor 6 continually looks up values in the look-up table for an optimum fan speed and an optimum current flow rate at the measured temperatures, and adjusts the fan speed and the current rate to the lookup values. For example, when a desired temperature of the cavity 5 as entered via the keypad 13 is 40° F., the surface temperature of the first plate of the thermal electric module 1 is 50° F., and the measured temperature of the cavity 5 is 75° F., then the optimum values of the fan speed and the current flow rate as stored in the look-up table may be two revolutions/second and 0.5 amp/second, respectively. The microprocessor 6 controls the operation of the system to attain the look-up values.

As a second example, when the surface temperature of the first plate of the module 1 is 15° F., and the measured temperature of the cavity 5 and the operator inputted desired temperature are the same as in the previous example, the optimum values of the fan speed and the current flow rate as stored in the look-up table may be six revolutions/second and 0.5 amp/second. The fan speed is slower in the first example to allow the system to wait for the surface of the first plate to get colder. When the first plate does get colder, as in the second example, the fan speed is increased so that colder air can be blown off the colder surface of the first plate and into the cavity 5.

In order to control the operation of the system, the microprocessor 6 generates a fan control signal for the fan 2 and a module control signal for the thermal electric module 1. The fan control signal and the module control signal may be used to vary the amount of power supplied from power supply 10 to the fan 2 and thermal electric module 1, respectively, thereby changing the fan speed and temperature of the thermal electric module 1. The variation in the amount of power can be accomplished via pulse width modulation of the power signal supplied from the power supply 10.

In the disclosed embodiment, pulse width modulation of the power signal from the power supply is attained via switches 8, 9. Switches 8, 9 are coupled between the power supply 10 and the thermal electric module 1 and the fan 2, respectively. The switches 8, 9 may be transistors, for example FETs, or other electronic switches that control the passage of the power signal to the module 1 and the fan 2, respectively, in response to the fan control signal and the thermal electric module control signal. The fan control signal generated by the microprocessor 6 controls the opening and closing of switch 9 to modulate the power signal appropriately based on the looked-up optimum fan speed in the look-up table 14. For example, when the optimum fan speed from the lookup table is greater than the measured speed of the fan, then the pulse-width of the power signal for the fan is increased by the microprocessor. When the pulse-width of the power signal for the fan 2 is increased, a rotational force that is applied to the fan 2 to increase the fan speed is applied for longer periods. With longer application periods of the rotational force, the fan speed increases.

Similarly, the module control signal generated by the microprocessor 6 controls the opening and closing of the switch 8 to modulate the power signal appropriately based on the optimum current flow rate from the look-up table. For example, when the look-up optimum current flow rate is greater than the measured current rate of the module 1, then the pulse-width of the power signal for the thermal electric module 1 is increased by the microprocessor 6. When the duty cycle of the power signal for the thermal electric module 1 is high, the control signal turns on the switch 8 for longer periods of time so that the supply voltage from the power supply 10 and an accompanying current is applied to the module 1 for correspondingly longer periods of time. When the duty cycle of the power signal for the thermal electric module 1 is lowered, the switch 8 is turned off for longer periods of time, and less current is applied to the module 1 via the switch 8.

Figure 2:
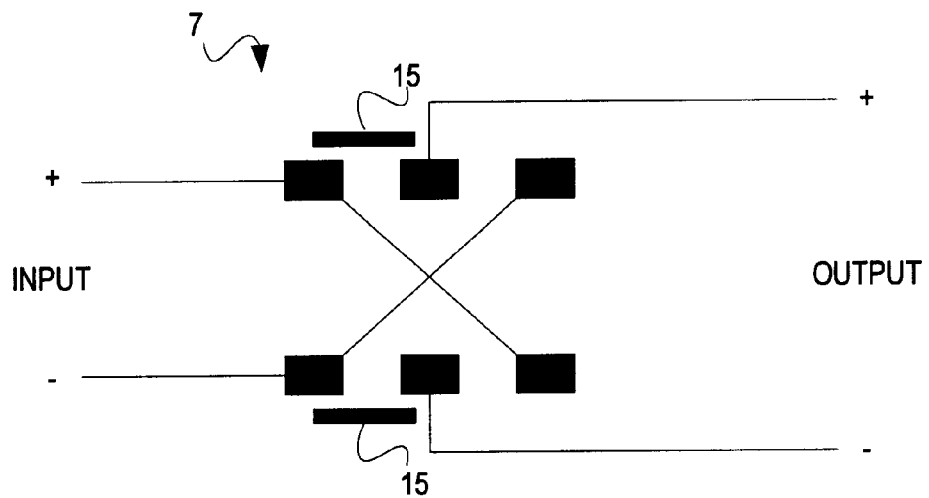
FIG. 2 illustrates a heat-cold switch which reverses the polarity of a voltage applied across the thermal electric module of FIG. 1, where the switch is switched to a first position.
Figure 3:
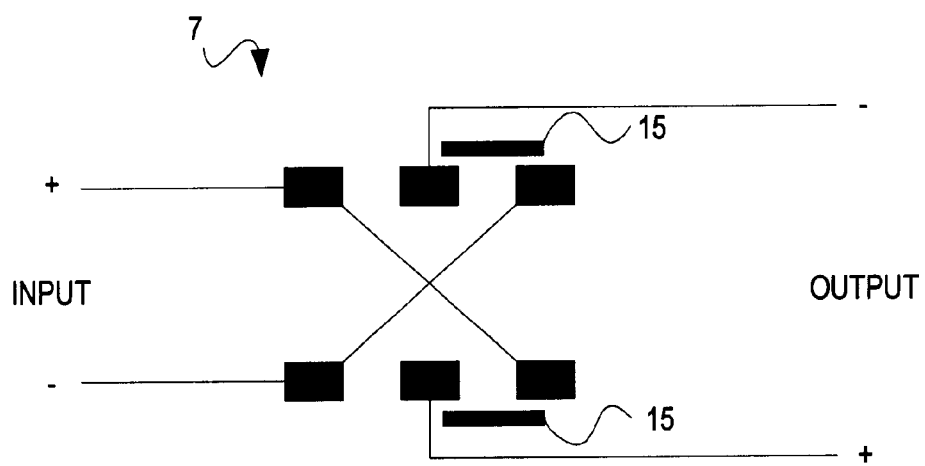
FIG. 3 illustrates a heat-cold switch which reverses the polarity of a voltage applied across the thermal electric module of FIG. 1, where the switch is switched to a second position.

FIGS. 2-3 illustrate an example of a heat-cold switch 7 which reverses the polarity of the voltage applied across the thermal electric module 1 of FIG. 1. By sliding the switch 15 to a first position as in FIG. 2, a voltage of first polarity is supplied to the thermal electric module 1. By sliding the switch 15 to a second position as in FIG. 3, a voltage of a second polarity, which is opposite of the first polarity, is supplied to the module 1.

While various embodiments of the present invention have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A portable heater/cooler system, comprising:
   a thermal electric module conducting a current through the module;
   a heater/cooler cavity coupled to the thermal electric module;
   a variable speed fan for blowing air over the thermal electric module and into the cavity;
   a first temperature sensor coupled to the thermal electric module for measuring the temperature of the module;
   a second temperature sensor coupled to the heater/cooler cavity for measuring the temperature in the cavity; and
   a microprocessor for adjusting a speed of the fan and the current flow through the thermal electric module as a function of the measured temperatures of the thermal electric module and the cavity.

2. The system of claim 1, wherein the microprocessor generates a first pulse-width control signal for controlling the speed of the fan and a second pulse-width control signal for controlling the temperature of the thermal electric module, the duty cycles of the first and second control signals being a function of the measured temperatures of the thermal electric module and the cavity.

3. The system of claim 1, wherein the microprocessor has a storage area for storing a look-up table, the look-up table containing a plurality of values of the rate of the current flow to the thermal electric module related to the fan speed for each combination of the measured temperature of the thermal electric module and the measured temperature of the cavity; and
   wherein the microprocessor looks up a fan speed and a current flow for the module in the look-up table when the measured temperature of the cavity and a desired cavity temperature differ, and changes the fan speed and current flow to the looked up fan speed and current flow values.

4. The system of claim 1, further comprising a heat/cold switch coupled to the thermal electric module, wherein the heat/cold switch is in a first position operative to cause the thermal electric module to heat.

5. The system of claim 1, further comprising a heat/cold switch coupled to the thermal electric module, wherein the heat/cold switch is in a second position operative to cause the thermal electric module to cool.

6. A heater/cooler system, comprising:
   a housing defining a cavity;
   a thermal electric module in communication with the cavity;
   an adjustable speed fan, the fan being arranged to blow air across the thermal electric module and into the cavity;
   a power supply supplying power to the fan and the thermal electric module;
   a first temperature sensor arranged to measure a temperature of the thermal electric module;
   a second temperature sensor arranged to measure a temperature in the cavity; and
   a microprocessor receiving the temperatures of the thermal electric module and the cavity and controlling the power supplied to the fan and the power supplied to the thermal electric module based on at least one of the temperature in the cavity, the temperature of the thermal electric module, and a current flowing through the thermal electric module.

7. The heater/cooler of claim 6, further comprising:
   a first switch coupled between the power supply and the fan;
   a second switch coupled between the power supply and the thermal electric module, wherein the microprocessor controls the opening and closing of the first and second switches to pulse width modulate the power supplied to the fan and to the thermal electric module.

8. The heater/cooler of claim 6, further comprising a display coupled to the microprocessor.

9. The heater/cooler of claim 6, further comprising an input device for receiving input from an operator and communicating the operator input to the microprocessor.

10. The heater/cooler of claim 7, further comprising a third switch coupled between the thermal electric module and the power supply, the third switch being movable between a first and a second position, in the first position, the third switch supplies a voltage of a first polarity to the thermal electric module and in the second position, the third switch supplies a voltage of an opposite polarity to the first polarity to the thermal electric module.

11. The heater/cooler of claim 6, further comprising a voltage regulator coupled between the power supply and the microprocessor.

12. The heater/cooler of claim 7, wherein the first and second switches are power transistors.

13. The heater/cooler of claim 6, wherein the first and second temperature sensors are thermistors.

14. In a heater/cooler system including a thermal electric module in communication with a cavity; an adjustable speed fan arranged to blow air across the thermal electric module and into the cavity; a power supply supplying power to the fan and the thermal electric module; and a microprocessor, a method for controlling a temperature in the cavity, the method comprising:
   providing a module power signal from the power supply to the thermal electric module;
   providing a fan power signal to the fan;

blowing air with the fan through the thermal electric module and into the cavity;

detecting a temperature of the thermal electric module;

detecting a temperature in the cavity;

adjusting the module power signal via the microprocessor based on the temperature in the cavity; and adjusting the fan power signal via the microprocessor based on at least one of the temperature of the thermal electric module and a current flowing through the thermal electric module.

15. The method of claim 14, further comprising:

inputting a selected cavity temperature from an input device to the microprocessor; and adjusting the module power signal and fan power signal based on the selected cavity temperature.

16. The method of claim 14, wherein the module power signal and fan power signal are pulse width modulated power signals.

17. The method of claim 14, further comprising storing in the microprocessor a table containing optimum fan speeds and optimum current flow rates based on the measured temperature in the cavity.

18. The method of claim 14, including slowing a speed of the fan until the temperature of the module is warmed when the temperature of the thermal electric module is too cool to achieve a desired temperature of the cavity.

19. The method of claim 14, including slowing a speed of the fan until the temperature of the module is cooled when the temperature of the thermal electric module is too warm to achieve a desired temperature of the cavity.

* * * * *